United States Patent
Krenz et al.

(10) Patent No.: US 7,190,301 B2
(45) Date of Patent: Mar. 13, 2007

(54) RADIO FREQUENCY ANECHOIC CHAMBER WITH NONPERTURBING WIRELESS SIGNALLING MEANS

(75) Inventors: Eric L. Krenz, Crystal Lake, IL (US); John R. Peters, Maple Park, IL (US)

(73) Assignee: Motorola, Inc., Schaumburg, IL (US)

( * ) Notice: Subject to any disclaimer, the term of this patent is extended or adjusted under 35 U.S.C. 154(b) by 183 days.

(21) Appl. No.: 11/020,770

(22) Filed: Dec. 22, 2004

(65) Prior Publication Data

US 2006/0132355 A1    Jun. 22, 2006

(51) Int. Cl.
*G01S 7/40* (2006.01)
*H01Q 17/00* (2006.01)

(52) U.S. Cl. .............. 342/1; 342/4; 342/165

(58) Field of Classification Search .......... 342/1, 342/4, 165, 173, 174, 175
See application file for complete search history.

(56) References Cited

U.S. PATENT DOCUMENTS

| | | | |
|---|---|---|---|
| 1,911,470 A | | 5/1933 | Rosner |
| 2,018,353 A | | 10/1935 | Gothe |
| 2,495,867 A | | 1/1950 | Peters |
| 2,566,335 A | | 9/1951 | Jorren |
| 2,587,916 A | | 3/1952 | Squier |
| 2,798,204 A | * | 7/1957 | Bennett ............ 333/136 |
| 3,105,287 A | | 10/1963 | Whearley et al. |
| 3,106,599 A | | 10/1963 | Leitner et al. |
| 4,029,891 A | | 6/1977 | Nakata |
| 4,396,797 A | | 8/1983 | Sakuragi et al. |
| 4,968,983 A | | 11/1990 | Maeda |
| 5,028,928 A | | 7/1991 | Vidmar et al. |
| 5,053,712 A | * | 10/1991 | Hansen .............. 324/627 |
| 5,455,548 A | | 10/1995 | Grandchamp et al. |
| 5,594,446 A | * | 1/1997 | Vidmar et al. ............ 342/1 |
| 5,902,957 A | | 5/1999 | Takahashi et al. |
| 6,239,751 B1 | * | 5/2001 | McRae et al. ....... 343/700 MS |
| 6,456,241 B1 | * | 9/2002 | Rothe et al. ......... 343/700 MS |
| 6,636,039 B1 | * | 10/2003 | Nistler ............... 324/318 |
| 7,102,562 B2 | * | 9/2006 | Moller et al. ............ 342/4 |
| 2004/0046557 A1 | | 3/2004 | Kamarkar et al. |
| 2004/0183547 A1 | * | 9/2004 | Kildal ............... 324/627 |

(Continued)

FOREIGN PATENT DOCUMENTS

EP    1580566 A1 *   9/2005

(Continued)

OTHER PUBLICATIONS

ETS Lindgren, An ESCO Technologies Company, "Antenna Measurement System AMS-8000", 2003.

(Continued)

*Primary Examiner*—John B. Sotomayor
(74) *Attorney, Agent, or Firm*—Philip Premysler; Sylvia Chen

(57) ABSTRACT

An anechoic chamber (100) is provided with a system for introducing wireless communication signals into the anechoic chamber (100) for establishing wireless signaling with equipment under test (122), without interfering with signals from the equipment under test (122) that are to be measured in the anechoic chamber (100). The system comprises a low reflection cross-section cable (236) that extends through the chamber (100) to a weakly radiating small antenna (242, 502) that is positioned proximate the equipment under test (122).

10 Claims, 3 Drawing Sheets

U.S. PATENT DOCUMENTS

| | | | |
|---|---|---|---|
| 2005/0018280 A1* | 1/2005 | Richardson | 359/368 |
| 2005/0194209 A1* | 9/2005 | Yang et al. | 181/286 |
| 2005/0206550 A1* | 9/2005 | Moller et al. | 342/4 |
| 2006/0132355 A1* | 6/2006 | Krenz et al. | 342/165 |

FOREIGN PATENT DOCUMENTS

| | | |
|---|---|---|
| JP | 2005274570 A * | 10/2005 |
| WO | WO 03/012465 A1 | 2/2003 |

OTHER PUBLICATIONS

R. Lowe and K. Cawley; Optimizing Test Performance of Digital Cellular Products With Ultra-High Speed Power Supplies; 2000.

James P. Phillips, Eric L. Krenz, Andrew A. Efanov; Spherical-Scan Near-Field Chamber For Cellular Phones; AMTA '98 Antenna Measurement Techniques Association 20th Annual Meeting and Symposium; Montreal, Quebec, Canada; Oct. 1998, pp. 37-42.

* cited by examiner

RADIO FREQUENCY ANECHOIC CHAMBER WITH NONPERTURBING WIRELESS SIGNALLING MEANS

FIELD OF THE INVENTION

The present invention relates in general to radio frequency testing.

BACKGROUND OF THE INVENTION

Radio frequency anechoic chambers are used to provide controlled repeatable environments for performing radio frequency radiation tests. Radio frequency anechoic chambers are meant to approximate unbounded regions of free space for electromagnetic waves and are meant to provide environments in which radio frequency radiation tests can be made without introducing errors caused by reflected waves or standing waves.

One type of test performed in radio frequency anechoic chambers is the measurement of power radiated from a piece of radio frequency equipment (termed the Equipment Under Test, EUT) as a function of polar and azimuth angle. Such a test allows a complete characterization of the spatial dependence of electromagnetic waves radiated by the EUT. The floor, ceiling and walls of radio frequency anechoic chambers are tiled with radio frequency absorbers that are provided to substantially diminish reflections and standing waves. The EUT is supported away from the absorbing walls, ceiling and floor, in order to make measurements. Elevating the EUT with a support also allows a measurement antenna to be moved so as to view the EUT from a wide range (nearly 180 degrees) of polar angle. To avoid large disturbances of the radio frequency fields emitted by the EUT, the support is made from dielectric materials as opposed to metal. An improved test stand that is suitably used in anechoic chambers is covered in co-pending patent application Ser. No. 10/805996.

One measure of the quality of an anechoic chamber is the magnitude of unwanted reflections. In an ideal anechoic chamber, there are no reflections. One way to measure the level of unwanted reflections of radio frequency waves in an anechoic chamber that is configured for measuring radiated radio frequency wave power as a function of polar angle, is to install a transmitting antenna that radiates uniformly as a function of polar angle (e.g., a horizontally oriented dipole) at a center of rotation and rotate a receiving antenna over a large range of polar angle with respect to the transmitting antenna while measuring the power received by the receiving antenna. In an ideal radio frequency anechoic chamber there would be no variation in the measured field. The variation that occurs is termed "ripple". Ripple can arise from a variety of sources.

Certain tests performed in anechoic chambers call for wireless communication to be maintained between the EUT and a test equipment transceiver. For example, to simulate real use, the power radiated from the EUT is suitably measured while the EUT is exchanging signals with a test equipment transceiver. In order for a test equipment transceiver to be able to communicate wirelessly with an EUT, an antenna that is connected to the test equipment transceiver is placed in the anechoic chamber. In certain commercial systems, a spiral antenna is placed in an anechoic chamber. Placing an additional antenna in an anechoic chamber has the drawback that the additional antenna will partly reflect signals emitted by the EUT, thereby increasing the ripple in the anechoic chamber. Thus, there is a desire to maintain a wireless link between an EUT and a test equipment transceiver without introducing an antenna that will cause substantial reflections and increase the amount of ripple.

BRIEF DESCRIPTION OF THE FIGURES

The present invention will be described by way of exemplary embodiments, but not limitations, illustrated in the accompanying drawings in which like references denote similar elements, and in which.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Figure 1:
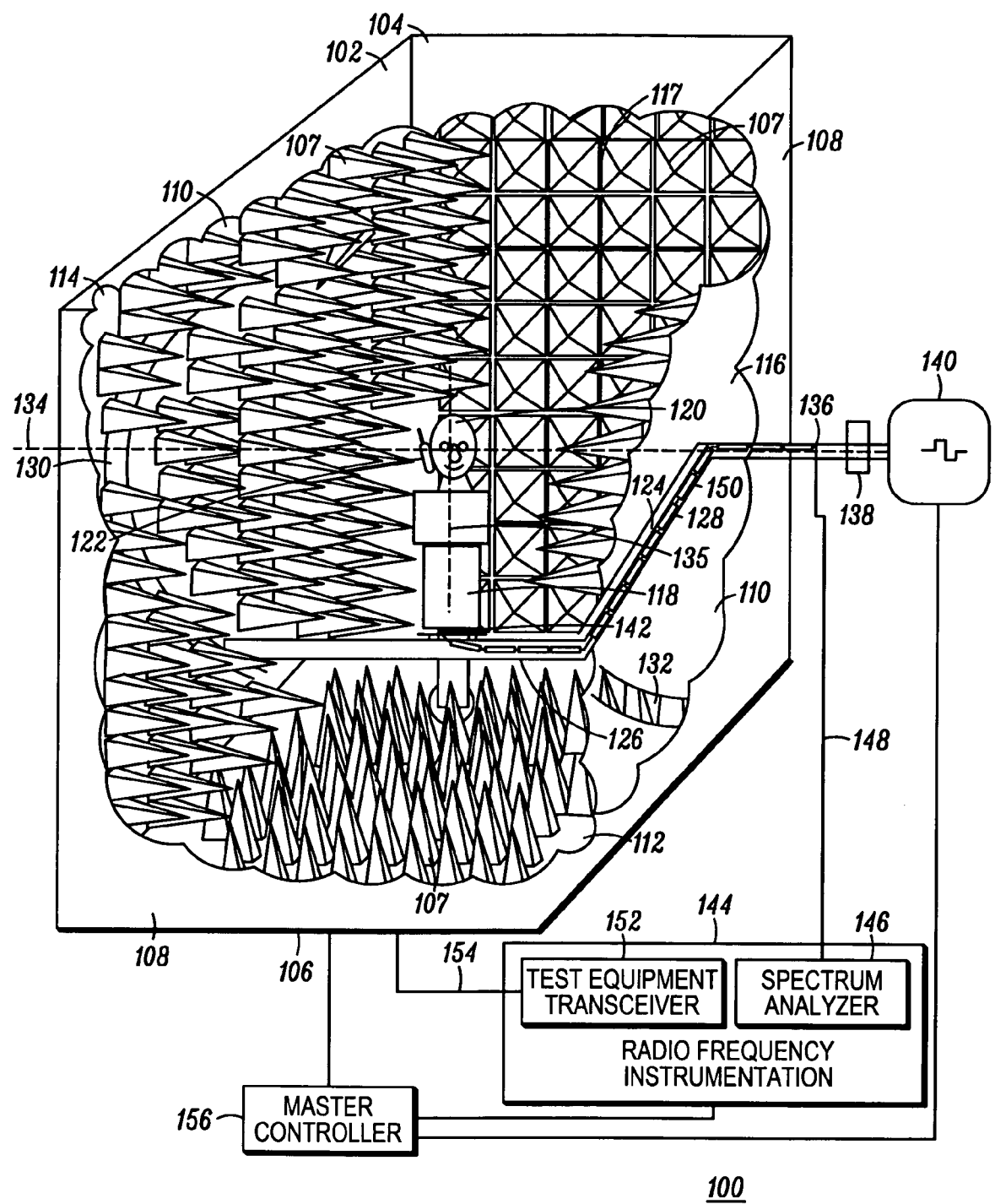
FIG. 1 is a cut-away view of a radio frequency anechoic chamber according to an embodiment.

FIG. 1 is a cut-away view of a radio frequency anechoic chamber 100 according to an embodiment. The anechoic chamber 100 is bounded by a metal outer skin 102. The metal outer skin 102 serves to block radio frequency or other electromagnetic interference emanating from outside the anechoic chamber 100 from entering the anechoic chamber 100 and corrupting measurements taken in the chamber 100. In the embodiment shown in FIG. 1, the anechoic chamber 100 is box shaped, and the metal outer skin 102 comprises a ceiling 104, a floor 106, and four walls 108 (two of which are partially visible in FIG. 1). Alternatively, the anechoic chamber 100 has a different shape such as another prism shape (e.g., pentagonal, hexagonal), a cylindrical shape or a hemispherical shape, for example.

Within the metal skin 102 is an inner enclosure 110 that is made from plywood or some other material. A second metal skin (not shown) is optionally included inside the inner enclosure 110. In the embodiment shown in FIG. 1, the inner enclosure 110 comprises a floor 112, a ceiling (not visible in FIG. 1), a left wall 114, a right wall 116, a back wall 117, and a front wall (not visible in FIG. 1).

The inner enclosure 110 is lined with radio frequency absorbing material. In the embodiment shown in FIG. 1, the radio frequency absorbing material takes the form of pyramidal radio frequency absorbers 107 that are tiled on the inner surfaces of the inner enclosure 110. The pyramidal radio frequency absorbers 107 serve to reduce reflections and standing waves in the chamber 100.

A test stand 118 is located in the middle of the floor 112 of the inner enclosure 110. The test stand 118 is more fully described below with references to FIG. 2. As shown in FIG. 1, the test stand 118 supports an EUT 122 (e.g., a cellular telephone) and a "phantom head" 120. The phantom head 120 is a hollow model of a human head that is filled with a fluid that approximates the electrical characteristics of a real person's head. A cellular telephone is often operated while held adjacent to a user's head. The phantom head 120 is used to simulate the effect of a person's head on the radio frequency field generated by a cellular telephone. As shown, the cellular telephone EUT 122 is mounted to the phantom head 120. Rubber bands, packaging tape, adhesives or special mounts are suitable for attaching a cellular telephone EUT 122 to the phantom head 120.

A U-shaped swing arm 124 is disposed in the chamber 100. The swing arm 124 includes a horizontal beam 126 that is connected perpendicularly at opposite ends to a first radial arm 128, and a second radial arm (not visible in FIG. 1). The horizontal beam 126 extends through a first arcuate slot 130 in the left wall 114 of the inner enclosure 110, and a congruently shaped second arcuate slot 132 in the right wall 116 of the inner enclosure 110. The first radial arm 128 is disposed between the right wall 116 of the inner enclosure 110 and the outer skin 102. Similarly, the second radial arm (which parallels the first radial arm, but is not visible in FIG. 1) is disposed between the left wall 114 of the inner enclosure 110 and the outer skin 102. Ends of the two radial arms 128 remote from the horizontal beam 126 extend to a virtual pivot axis 134, about which the swing arm 124 rotates. The virtual pivot axis 134 intersects an axis 135 through the test stand 118. At the virtual pivot axis 134, the first radial arm 128 is connected to a first shaft 136, and the second radial arm (not shown) is coupled to a second shaft (not shown). The first shaft 136 extends through the outer skin 102 and is supported by a bearing 138. The second shaft (not shown) is suitably similarly supported. The first shaft 136 is coupled to a first stepper motor 140 that is used to rotate the swing arm 124 and thereby control the polar angle of the horizontal beam 126 with respect to the EUT 122.

The horizontal beam 126 supports a measurement antenna 142 that is typically used to receive signals from the EUT 122. The measurement antenna 142 can be swung through a range of polar angles about the EUT 122 mounted on the test stand 118.

Although not shown in FIG. 1, the test stand 118 is suitably supported on a rotation mechanism 222 (FIG. 2) located at the floor 112 of the inner enclosure 110. The rotation mechanism 222 allows the azimuth of the test stand 118 carrying the EUT 122 to be varied relative to the measurement antenna 142. Thus, radio frequency signals emitted by the EUT 122 over a range of polar and azimuth angles can be measured in the chamber 100.

Figure 2:
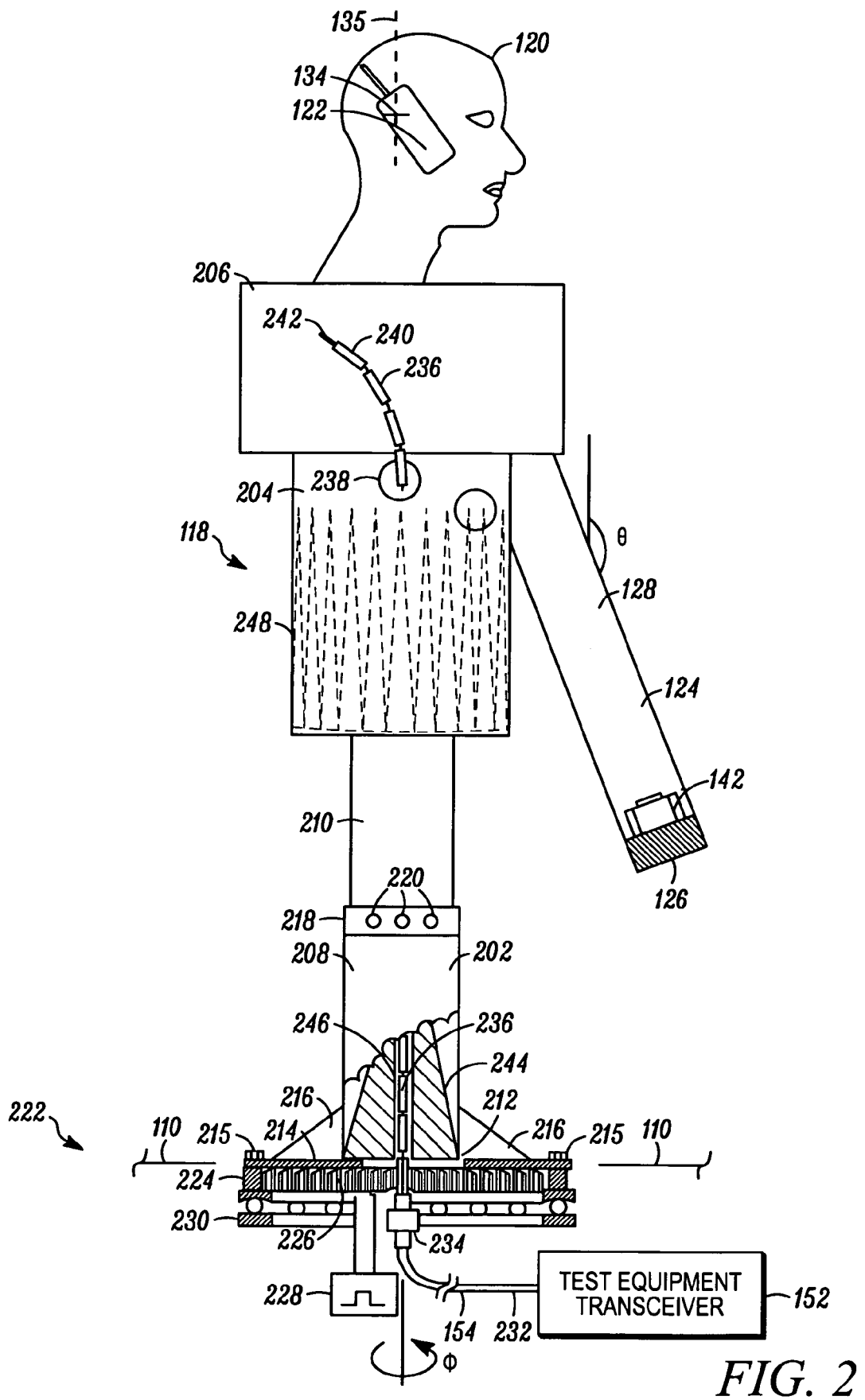
FIG. 2 is a cut-away side view of a test stand, along with half of a U-shaped swing arm used to support a measurement antenna in the radio frequency anechoic chamber shown in FIG. 1.

Radio frequency instrumentation 144 is located outside the chamber 100. The radio frequency instrumentation 144 comprises a spectrum analyzer 146 (or other equipment suitable for making radio frequency measurements) that is coupled to the measurement antenna 142 by a first coaxial cable 148 that includes a first segment of low reflection cross-section cable 150 that extends along the first radial arm 128 and the horizontal beam 126 of the swing arm 124. Using the first segment of low reflection cross-section cable 150 reduces unwanted reflections in the chamber 100. The radio frequency instrumentation 144 also includes a test equipment transceiver 152 that is coupled by a second coaxial cable 154 to a small, sub-resonance monopole antenna 242 (FIG. 2). If the EUT is a cellular telephone, a base station simulator is suitably used as the test equipment transceiver 152. The radio frequency instrumentation 144 is capable of operating at a frequency of operation of the EUT 122.

A master controller 156 (e.g. a personal computer equipped with test instrument interfacing hardware and software) is coupled to the radio frequency instrumentation 144, the first stepper motor 140, and to a second stepper motor 228 (FIG. 2) of the rotating mechanism 222 (FIG. 2) that controls the azimuth of the test stand 118. The master controller 156, although not essential, allows testing to be automated.

FIG. 2 is a cut-away side view of the test stand 118 shown in FIG. 1, along with half of the U-shaped swing arm 124 used to support the measurement antenna 142 in the radio frequency anechoic chamber 100. The test stand 118 comprises a lower vertical support column 202, a middle vertical support column 204, and an upper support member 206. Aspects of the test stand 118 are covered in co-pending application Ser. No. 10/805,996. The lower vertical support column 202 includes a lower tube 208, and an upper tube 210. The upper tube 210 can be inserted to different depths in the lower tube 208 in order to set the height of the test stand 118. A dielectric collar 218 and a plurality of dielectric bolts 220 are used to set the insertion depth of the upper tube 210 into the lower tube 208. A bottom end 212 of the lower tube 208 is attached to a mounting flange 214 with the aid of a plurality of gussets 216. The lower vertical support column 202 and middle vertical support column 204 suitably comprise hollow fiberglass tubes. The upper support member 206 suitably comprises a block of expanded polystyrene.

The mounting flange 214 is disposed on the rotation mechanism 222. The rotation mechanism 222 comprises a first gear 224 (e.g., a ring gear) that is attached to the mounting flange 214 with a plurality of fasteners 215 and a second gear 226 (e.g., a pinion gear) that is coupled to the second stepper motor 228 and engaged with the first gear 224. A bearing assembly 230 rotatably supports the first gear 224 and the test stand 118.

The second coaxial cable 154 includes a first portion 232 that extends from the test equipment transceiver 152 to a rotary coaxial cable joint 234. The rotary coaxial cable joint is suitably positioned on the axis 135 of the test stand 118 near the bottom end 212 of the lower tube 208. A second segment of low reflection cross-section cable 236 extends from the rotary coaxial cable joint 234 up through the lower vertical support column 202, into the middle vertical support column 204, out of a side hole 238 in the middle vertical support column 204 and to the upper support member 206. An end 240 of the second segment of low reflection cross-section cable 236 is suitably attached (e.g., with packaging tape, not shown) to the upper support member 206.

The small sub-resonance monopole antenna 242, which has a length that yields a resonant frequency substantially above the frequency of the EUT 122, extends from the end 240 of the second segment of low reflection cross-section cable 236. The small sub-resonance monopole antenna 242 is suitably less than ⅛ of the free space wavelength corresponding to the frequency of the EUT 122. Although the radiative efficiency of the small sub-resonance monopole antenna 242 is low (at the frequency of the EUT 122) due to the small size, given the close proximity of the antenna 242 to the EUT 122, the antenna 242 is able to effectively exchange wireless signals with the EUT 122. Significantly, the small sub-resonance monopole antenna 242 has a relatively small perturbative effect on fields radiated by the EUT 122, so that the small sub-resonance monopole antenna 242 does not greatly increase the ripple of the anechoic chamber 100. Because the small sub-resonance monopole antenna 242 rotates with the EUT 122 (i.e., maintains a fixed relationship with the EUT 122), there is a no risk of losing communication due to the EUT moving into an antenna pattern null of the small sub-resonance monopole antenna 242 or vice versa. The fixed relationship facilitates the use of the small sub-resonance monopole antenna 242.

A pyramidal absorber 244 of the type used to line the chamber 100, but which has been trimmed near the base to fit within the lower tube 208, is positioned within the lower tube 208. The pyramidal absorber 244 in the lower vertical support column 202 serves to dampen interaction between the EUT 122, and the rotation mechanism 222, which might otherwise degrade the ripple performance of the chamber 100. The second segment of low reflection cross-section cable 236 extends through a longitudinal hole 246 in the pyramidal absorber 244. A sheet of microwave absorbing material 248 that is cut to form a series of upwardly extending narrow tapered portions is used to line the middle vertical support column 204. The microwave absorbing material 248 also serves to improve the ripple performance of the anechoic chamber 100.

Figure 3:
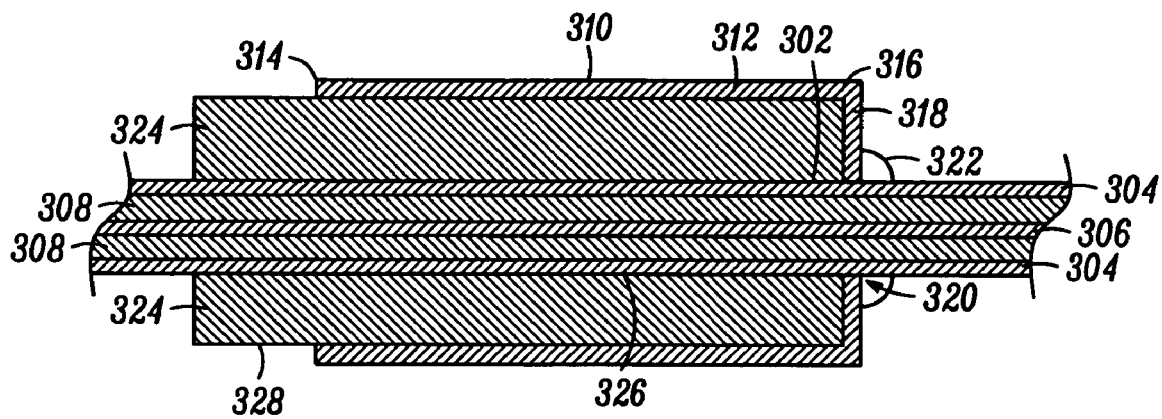
FIG. 3 is a sectional view of a portion of a low reflection cross-section cable used in the radio frequency anechoic chamber shown in FIG. 1.

FIG. 3 is a sectional view of a portion of the low reflection cross-section cable 150, 236 used in the radio frequency anechoic chamber 100 shown in FIG. 1. The low reflection cross-section cable 150, 236 comprises a coaxial cable 302 that includes a tubular outer conductor 304 and an inner conductor 306 that is arranged coaxially within the tubular outer conductor 304. A cylindrical insulator 308 is disposed between the outer conductor 304 and the inner conductor 306.

In FIG. 3, one of a series of cylindrical resonators 310 (also referred to as chokes) that are arranged one after another along the low reflection cross-section cable 150, 236 is shown. The resonators 310 serve to reduce reflections from the low reflection cross-section cable 150, 236, and thereby improve the ripple performance of the anechoic chamber 100. Each of the resonators 310 comprise a cylinder 312 having an open first end 314 and a second end 316 that is closed by a circular wall 318 that includes a central hole 320 through which the coaxial cable 302 passes. Solder or other conductive joint material 322 is used to establish electrical contact between the tubular outer conductor 304 of the coaxial cable 302 and the circular wall 318 at the central hole 320. A cylindrical dielectric plug 324 is positioned within each resonator 310. The cylindrical dielectric plug 324 includes an axial bore 326 that is aligned with the central hole 320 in the circular wall 318. The coaxial cable 302 extends through each axial bore 326 in each cylindrical dielectric plug 324.

The cylindrical dielectric plug 324 extends out of the open first end 314. A protruding length 328 of each cylindrical dielectric plug 324 serves to maintain spacing between successive cylindrical resonators 310. Spacing the cylindrical resonators 310 serves to control a parasitic capacitance between the open first end 314 of one cylindrical resonator 310 and the second end 316 of an adjacent cylindrical resonator 310 so as to control the effect of the parasitic capacitance on the effective electrical length of the cylindrical resonators 310.

The resonators 310 are dimensioned and spaced so as to support a one-quarter wave coaxial mode resonance (including the effect of the fringe capacitance and dielectric loading) at a frequency nominally equal to the operating frequency of the EUT. Note that the outer conductor 304 of the coaxial cable 302 serves as an inner conductor of the cylindrical resonators 310.

Although, not wishing to bound by any particular theory of operation, it is believed that the cylindrical resonators 310 reduce reflections from the low reflection cross-section cable 150, 236 by creating an open circuit (at the operating frequency of the EUT 122) at approximately every quarter-wavelength along the cable's 150, 236 exterior, effectively breaking the cables 150, 236 into a series of short (less than quarter-wave) isolated conductors that are poor radiators.

Figure 4:
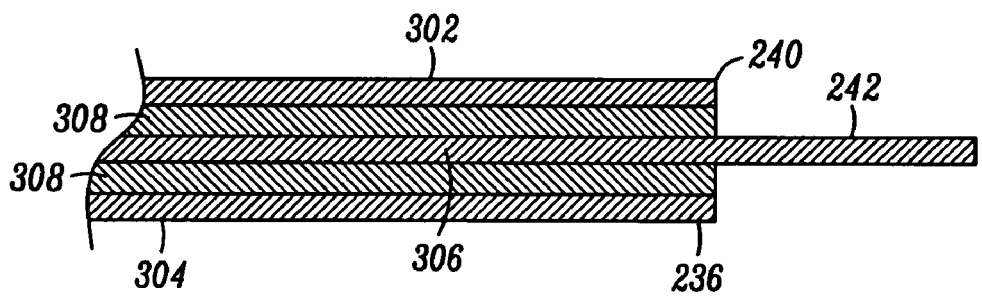
FIG. 4 is a sectional view of an end of the low reflection cross-section cable shown in FIG. 3 including a small sub-resonance monopole antenna.

FIG. 4 is a sectional view of the end 240 of the second segment of low reflection cross-section cable 236 shown in FIG. 2 including the small sub-resonance monopole antenna 242. As shown in FIG. 4, the small sub-resonance monopole antenna 242 is formed by extending the inner conductor 306 beyond the outer tubular conductor 304. The cylindrical resonators 310 are positioned on the coaxial cable 302 such that the open first end 314 of the cylindrical resonator 310 closest to the small sub-resonance monopole antenna 242 faces the antenna 242.

According to an alternative embodiment rather than extending the inner conductor 306 to form the low reflectance sub-resonance monopole antenna 242, the coaxial cable 302 is terminated with a first connector (e.g., an SMA coaxial connector) and the low reflectance sub-resonance monopole is attached to a second connector that mates with the first connector.

Figure 5:
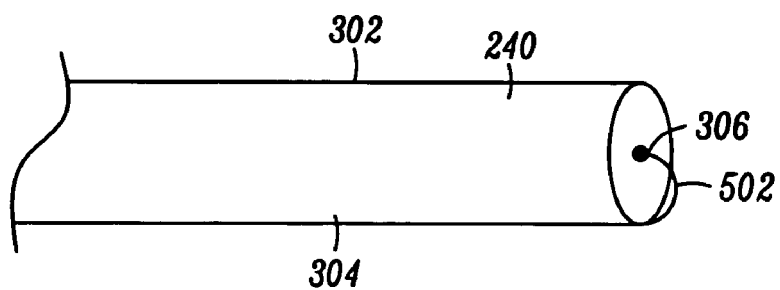
FIG. 5 shows an end portion of the low reflection cross-section cable shown in FIG. 3 including a small sub-resonance loop antenna according to an alternative embodiment.

FIG. 5 shows an end portion of the second segment of low reflection cross-section cable 236 shown in FIG. 2 including a loop antenna 502 according to an alternative embodiment. The loop antenna 502 is substantially smaller than would be required to support resonance at the operating frequency of the EUT 122. However, since the loop antenna 502 is to be positioned proximate the EUT 122 wireless signaling can be established between the EUT 122, and the loop antenna 502. The small size of the loop antenna 502 helps to minimize the ripple in the anechoic chamber 100.

As used herein the term 'radio frequency' is used in a general sense and includes all frequencies that are used for wireless communications and that are radiated and received using antennas.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

The invention claimed is:
1. An apparatus comprising:
  a radio frequency instrument adapted to operate at a frequency;
  a low reflection cross-section cable comprising:
    a coaxial cable;
    a first end coupled to the radio frequency instrument;
    a second end; and
    a plurality of cylindrical resonators through which said coaxial cable passes, wherein each of said plurality of cylindrical resonators comprises:
a cylinder having an open first end and a second end closed by a circular wall that includes a hole through which said coaxial cable passes;
an antenna coupled to said second end of said low reflection cross-section cable.

2. The apparatus according to claim 1 wherein said antenna is sized substantially below a size required for resonance at said frequency.

3. The apparatus according to claim 1 wherein said antenna comprises a monopole antenna.

4. The apparatus according to claim 3 wherein said monopole antenna has a length that is less than ⅛ of a free space wavelength corresponding to said frequency.

5. The apparatus according to claim 1 wherein said antenna comprises a loop antenna.

6. The apparatus according to claim 1 wherein each of said plurality of cylindrical resonators further comprise a dielectric plug disposed, at least partly, in said cylinder, said dielectric plug comprising an axial bore through which said coaxial cubic passes.

7. The apparatus according to claim 6 wherein said dielectric plug extends out of said cylinder.

8. The apparatus according to claim 1 further comprising an anechoic chamber wherein said radio frequency instrument is disposed outside said anechoic chamber, said antenna is disposed inside said anechoic chamber and said low reflection cross-section cable is disposed, at least partly, in said anechoic chamber.

9. An apparatus comprising:
an anechoic chamber for making measurements at, at least one frequency;
a rotatable test stand for supporting a piece of equipment under test, the rotatable test stand disposed in said anechoic chamber and having a rotary radio frequency coupling;
an antenna disposed in said anechoic chamber and mounted to said rotatable test stand, wherein said antenna is sized substantially below a size required for resonance at said at least one frequency; and
a low reflection cross-section cable comprising a first end coupled to said antenna and a second end.

10. The apparatus according to claim 9 wherein:
said rotatable test stand comprises an axis and an end; and
said rotary radio frequency coupling is disposal on said axis proximate said end.

* * * * *